United States Patent
Shen et al.

(10) Patent No.: US 10,714,471 B2
(45) Date of Patent: Jul. 14, 2020

(54) SEMICONDUCTOR DEVICE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Yihua Shen, Shanghai (CN); Yunchu Yu, Shanghai (CN); Jian Pan, Shanghai (CN); Fenghua Fu, Shanghai (CN)

(73) Assignees: Semiconductor Manufacturing International (Beijing) Corporation, Beijing (CN); Semiconductor Manfacturing International (Shanghai) Corporation, Shanghai (CN)

( * ) Notice: Subject to any disclaimer, the term of this patent is extended or adjusted under 35 U.S.C. 154(b) by 303 days.

(21) Appl. No.: 15/284,671

(22) Filed: Oct. 4, 2016

(65) Prior Publication Data

US 2017/0117275 A1    Apr. 27, 2017

(30) Foreign Application Priority Data

Oct. 22, 2015   (CN) .......................... 2015 1 0691122

(51) Int. Cl.
*H01L 21/8234* (2006.01)
*H01L 27/088* (2006.01)
(Continued)

(52) U.S. Cl.
CPC .... *H01L 27/0886* (2013.01); *H01L 21/76897* (2013.01); *H01L 21/823418* (2013.01);
(Continued)

(58) Field of Classification Search
CPC .......... H01L 27/0086; H01L 21/76897; H01L 29/66795–29/66818;
(Continued)

(56) References Cited

U.S. PATENT DOCUMENTS 7,667,271 B2 * 2/2010 Yu ..................... H01L 21/26586
                                                    257/347
8,916,475 B1    12/2014 Chen et al.
(Continued)

FOREIGN PATENT DOCUMENTS

EP       3 159 928    *  4/2017
KR    20090067373 A      6/2009

OTHER PUBLICATIONS

Written Opinion of EPO, dated Mar. 10, 2017.*
Zimmerman, Paul, Double patterning lithography: double the trouble or double the fun?, SPIE Newsroom, 3 Pages, 2009.

*Primary Examiner* — Mary A Wilczewski
(74) *Attorney, Agent, or Firm* — Anova Law Group, PLLC

(57) ABSTRACT

A method for fabricating a semiconductor device includes forming a first mask layer, a second mask layer, and a plurality of first patterned layers on an interlayer dielectric layer and a plurality of gate structures. A plurality of first openings separate the first patterned layers with each across a source region, a drain region, and a portion of an isolation area between the source and the drain regions. The second mask layer is then patterned by etching. The method includes forming a plurality of discrete second patterned layers above the isolation areas between source and drain regions and then forming a patterned first mask layer by etching. Further, the method includes forming a plurality of contact vias to expose the source/drain regions through (Continued)

etching using the patterned first mask layer and second mask layer as an etch mask, and then forming a metal silicide layer on each source/drain region.

17 Claims, 9 Drawing Sheets

(51) Int. Cl.
  *H01L 21/84*  (2006.01)
  *H01L 21/768*  (2006.01)
  *H01L 21/8238*  (2006.01)
  *H01L 21/311*  (2006.01)
  *H01L 21/285*  (2006.01)

(52) U.S. Cl.
  CPC ........ *H01L 21/823431* (2013.01); *H01L 21/823437* (2013.01); *H01L 21/823475* (2013.01); *H01L 21/823481* (2013.01); *H01L 21/823814* (2013.01); *H01L 21/823821* (2013.01); *H01L 21/823871* (2013.01); *H01L 21/84* (2013.01); *H01L 21/845* (2013.01); *H01L 21/28518* (2013.01); *H01L 21/31144* (2013.01); *H01L 21/76843* (2013.01); *H01L 21/76855* (2013.01)

(58) Field of Classification Search
  CPC ......... H01L 29/785–29/7856; H01L 29/7848; H01L 21/845; H01L 21/8238–21/823892
  USPC ............................................ 257/401
  See application file for complete search history.

(56) References Cited

U.S. PATENT DOCUMENTS

| | | | |
|---|---|---|---|
| 9,093,425 B1* | 7/2015 | Breil | H01L 29/456 |
| 9,230,816 B1* | 1/2016 | Hung | H01L 21/28518 |
| 9,263,551 B2* | 2/2016 | Liu | H01L 21/82382 |
| 2007/0020565 A1* | 1/2007 | Koh | G03F 7/0035 |
| | | | 430/313 |
| 2007/0066047 A1* | 3/2007 | Ye | H01L 21/31144 |
| | | | 438/620 |
| 2008/0284029 A1* | 11/2008 | Kim | H01L 21/76829 |
| | | | 257/758 |
| 2009/0053657 A1 | 2/2009 | Hatakeyama et al. | |
| 2009/0152734 A1 | 6/2009 | Smayling | |
| 2010/0123198 A1* | 5/2010 | Kim | H01L 21/26506 |
| | | | 257/377 |
| 2011/0312145 A1* | 12/2011 | Tsai | H01L 21/26586 |
| | | | 438/300 |
| 2012/0122286 A1* | 5/2012 | Kim | H01L 21/28518 |
| | | | 438/300 |
| 2013/0292767 A1 | 11/2013 | Yang | |
| 2013/0343121 A1 | 12/2013 | Fukutome | |
| 2014/0199837 A1 | 7/2014 | Hung et al. | |
| 2014/0284725 A1 | 9/2014 | McMullan et al. | |
| 2014/0363984 A1* | 12/2014 | Fukuda | H01L 21/0274 |
| | | | 438/778 |
| 2015/0187660 A1* | 7/2015 | Patzer | H01L 21/82386 |
| | | | 438/217 |
| 2015/0243552 A1* | 8/2015 | Lu | H01L 21/76802 |
| | | | 257/368 |
| 2015/0255287 A1* | 9/2015 | Shoji | H01L 21/266 |
| | | | 438/514 |
| 2015/0333148 A1* | 11/2015 | Koo | H01L 29/66545 |
| | | | 257/288 |
| 2016/0071799 A1* | 3/2016 | Hsieh | H01L 21/82387 |
| | | | 257/288 |
| 2016/0293715 A1* | 10/2016 | Zang | H01L 29/4991 |
| 2017/0047257 A1* | 2/2017 | Han | H01L 21/82343 |
| 2018/0337188 A1* | 11/2018 | Yu | H01L 21/26513 |
| 2019/0164774 A1* | 5/2019 | Lee | H01L 21/31116 |
| 2019/0165101 A1* | 5/2019 | Wang | H01L 29/0847 |
| 2019/0333915 A1* | 10/2019 | Lee | H01L 21/76832 |

* cited by examiner

SEMICONDUCTOR DEVICE AND FABRICATION METHOD THEREOF

CROSS-REFERENCES TO RELATED APPLICATIONS

This application claims the priority of Chinese Patent Application No. CN201510691122.4, filed on Oct. 22, 2015, the entire content of which is incorporated herein by reference.

FIELD OF THE DISCLOSURE

The present disclosure generally relates to the field of integrated circuit fabrication technology and, more particularly, relates to a semiconductor device and fabrication methods thereof.

BACKGROUND

With rapid development of semiconductor fabrication technology, semiconductor devices are developed towards a direction of having a higher component density and a higher integration degree. As one of the most fundamental semiconductor devices, transistors have been widely used. With the improvement of the component density and the integration degree, the size of the gate electrode in planar transistors becomes smaller and smaller. However, as the feature size decreases, the ability of traditional planar transistors in controlling the channel current becomes less sufficient, which may cause short channel effect and leakage current, and thus may ultimately affect the electrical performance of the semiconductor devices.

According to existing methods, fin-field effect transistor (Fin-FET) has been proposed in order to overcome the short channel effect and suppress the leakage current. A Fin-FET may be a multi-gate device.

As an example, a Fin-FET may include a substrate, a fin structure formed on the surface of the substrate, a dielectric isolation layer formed on the surface of the substrate and covering a portion of the sidewall surfaces of the fin structure, a gate structure formed on the surface of the dielectric isolation layer and the top and the sidewall surfaces of the fin structure, and a source region and a drain region formed in the fin structure on the two sides of the gate structure. The gate structure may include a gate dielectric layer formed on the surface of the dielectric isolation layer and a portion of sidewall and top surfaces of the fin structure, a gate electrode layer formed on the surface of the gate dielectric layer, and two sidewall spacers formed on the sidewall surfaces of the gate electrode layer and the gate dielectric layer. Moreover, conductive structures, such as conductive plugs and electrical interconnections, may be formed on at least one of the source region, the drain region, and the gate electrode layer of the Fin-FET in order to electrically connect the Fin-FET with other semiconductor components on the substrate to further form a chip circuit.

However, as the process node shrinks, the size of Fin-FETs decreases and the density of devices increases. Therefore, the fabrication process for Fin-FETs becomes more difficult and the electrical performance of the formed Fin-FETs still needs to be improved. The disclosed fabrication method and semiconductor device are directed to solve one or more problems set forth above and other problems in the art.

BRIEF SUMMARY OF THE DISCLOSURE

One aspect of the present disclosure includes a method for fabricating a semiconductor device. The method includes forming a plurality of gate structures on a base structure, forming a source/drain region in the base structure on each side of each gate structure, and forming an interlayer dielectric layer on the base structure to cover sidewall surfaces of the gate structures. The gate structures are separated by a plurality of isolation areas. The method further includes forming a first mask layer to cover the interlayer dielectric layer and the gate structures and a second mask layer to cover the first mask layer. The second mask layer and the first mask layer are made of different materials. Then, the method includes forming a plurality of first patterned layers on the second mask layer with the plurality of first patterned layers separated by a plurality of first openings. The projected pattern of the first patterned layers covers at least top surfaces of the gate structures and each first opening is formed across a source region, a neighboring drain region, and a portion of an isolation area between the source region and the drain region. The method further includes forming a patterned second mask layer by etching the second mask layer using the first patterned layers as an etch mask until a portion of the first mask layer is exposed, and forming a plurality of discrete second patterned layers on an exposed portion of first mask layer and a remaining portion of the second mask layer. The plurality of second patterned layers are formed vertically above the isolation areas between neighboring source and drain regions. Further, the method includes forming a patterned first mask layer by etching the first mask layer using the second patterned layers as an etch mask until a portion of the interlayer dielectric layer is exposed, and then forming a plurality of contact vias to expose top surfaces of source/drain regions by etching the interlayer dielectric layer using the patterned first mask layer and the patterned second mask layer as an etch mask. Finally, the method includes forming a plurality of metal silicide layers on the source/drain regions exposed in the plurality of contact vias.

Another aspect of the present disclosure provides a method for fabricating a semiconductor device. The method includes forming a plurality of gate structures on a base structure, forming a source/drain region in the base structure on each side of each gate structure, and forming an interlayer dielectric layer on the base structure to cover sidewall surfaces of the gate structures. The gate structures are separated by a plurality of isolation areas. The method further includes forming a first mask layer to cover the interlayer dielectric layer and the gate structures and a second mask layer to cover the first mask layer. The second mask layer and the first mask layer are made of different materials. Further, the method includes forming a plurality of discrete second patterned layers on the second mask layer with the second patterned layers formed vertically above the isolation areas between neighboring source and drain regions, forming a patterned second mask layer by etching the second mask layer using the second patterned layers as an etch mask until a portion of the first mask layer is exposed, and then forming a plurality of first patterned layers separated by a plurality of first openings on an exposed portion of first mask layer and a remaining portion of the second mask layer. The projected pattern of the first patterned layers covers at least top surfaces of the gate structures, and each first opening is formed across a source region, a neighboring drain region, and a portion of an isolation area between the source region and the drain region. The method further includes forming a patterned first mask layer by etching the first mask layer using the first patterned layers as an etch mask until a portion of the interlayer dielectric layer is exposed, and forming a plurality of contact vias to expose top surfaces of source/drain regions by etching the interlayer dielectric layer using the patterned first mask layer and the patterned second mask layer as an etch mask. Finally, the method includes forming a plurality of metal silicide layers on the source/drain regions exposed in the plurality of contact vias.

Another aspect of the present disclosure provides a semiconductor device. The semiconductor device includes a base structure including a plurality of active areas and a plurality of isolation areas separating the active areas, a plurality of gate structures formed on the base structure, an interlayer dielectric layer formed on the base structure and covering sidewall surfaces of the gate structures, and a plurality of metal silicide layers formed in a plurality of contact vias on the source/drain regions. The plurality of contact vias are formed on the source/drain regions by a method including the following steps. A first mask layer is formed on the interlayer dielectric layer and the gate structures and then a second mask layer is formed on the first mask layer. The second mask layer and the first mask layer are made of different materials. A plurality of first patterned layers are formed on the second mask layer and separated by a plurality of first openings. The projected pattern of the first patterned layers covers at least top surfaces of the gate structures and each first opening is formed across a source region, a neighboring drain region, and a portion of an isolation area between the source region and the drain region. Then, a patterned second mask layer is formed by etching the second mask layer using the first patterned layers as an etch mask until a portion of the first mask layer is exposed, and a plurality of discrete second patterned layers are formed on an exposed portion of first mask layer and a remaining portion of the second mask layer. The plurality of second patterned layers are formed vertically above the isolation areas between neighboring source and drain regions. A patterned first mask layer is then formed by etching the first mask layer using the second patterned layers as an etch mask until a portion of the interlayer dielectric layer is exposed. The plurality of contact vias are then formed to expose top surfaces of source/drain regions by etching the interlayer dielectric layer using the patterned first mask layer and the patterned second mask layer as an etch mask.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

According to existing Fin-FETs and fabrication methods, as the process node shrinks, the size of Fin-FETs decreases and the density of devices increases. Therefore, the fabrication process for Fin-FETs becomes more difficult and the electrical performance of the formed Fin-FETs still needs to be improved.

In existing Fin-FETs and fabrication methods, prior to forming conductive structures, a metal silicide layer is usually formed on the surface of each source/drain region in order to reduce the contact resistance between the source/drain region and the corresponding conductive structure. As the process node shrinks, the dimension of the metal silicide layer to be formed on the source/drain region also decreases. Therefore, further forming the metal silicide layer on the surface of the source/drain region may be more difficult and the morphology of the formed metal silicide layer may be poor.

A double-patterning method has been used to define the pattern of the metal silicide layer in order to reduce the challenges in forming the metal silicide layer and improve the morphology of the formed metal silicide layer. Specifically, the mask used to define the pattern of the metal silicide layer is broken down into two masks, namely, a first mask containing a first pattern and a second mask containing a second pattern. The first pattern is projected onto the surface of the substrate to form a first projected pattern and the second pattern is projected onto the surface of the substrate to form a second projected pattern. The first projected pattern is used to define a pattern for a metal silicide layer and the second projected pattern is used to define a pattern for a neighboring metal silicide layer. The distance between the first projected pattern and the second projected pattern defines the distance between the two neighboring metal silicide layers.

However, as the process node shrinks, the semiconductor process may be more and more difficult to control. For instance, the overlay issue in aligning the first mask and the second mask, the line end issue, the corner rounding issue, etc. may turn to be more and more crucial. As results, the position of the metal silicide layer formed on the surface of the source/drain region may not be accurate, the boundary morphology of the formed metal silicide layer may be poor, and the corner rounding issue may easily take place at the boundaries of the formed metal silicide layer. Therefore, the electrical properties of the formed metal silicide layer may not be stable, and thus the electrical performance of the formed semiconductor device may be poor.

Figure 17:
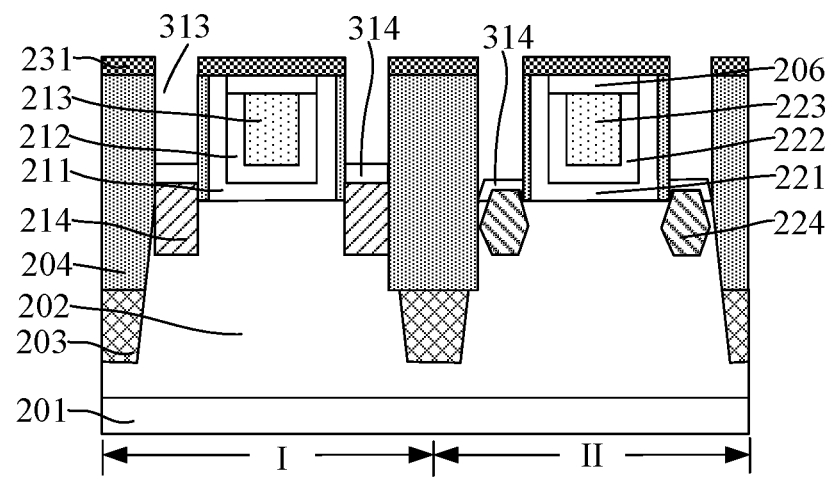
Figure 18:
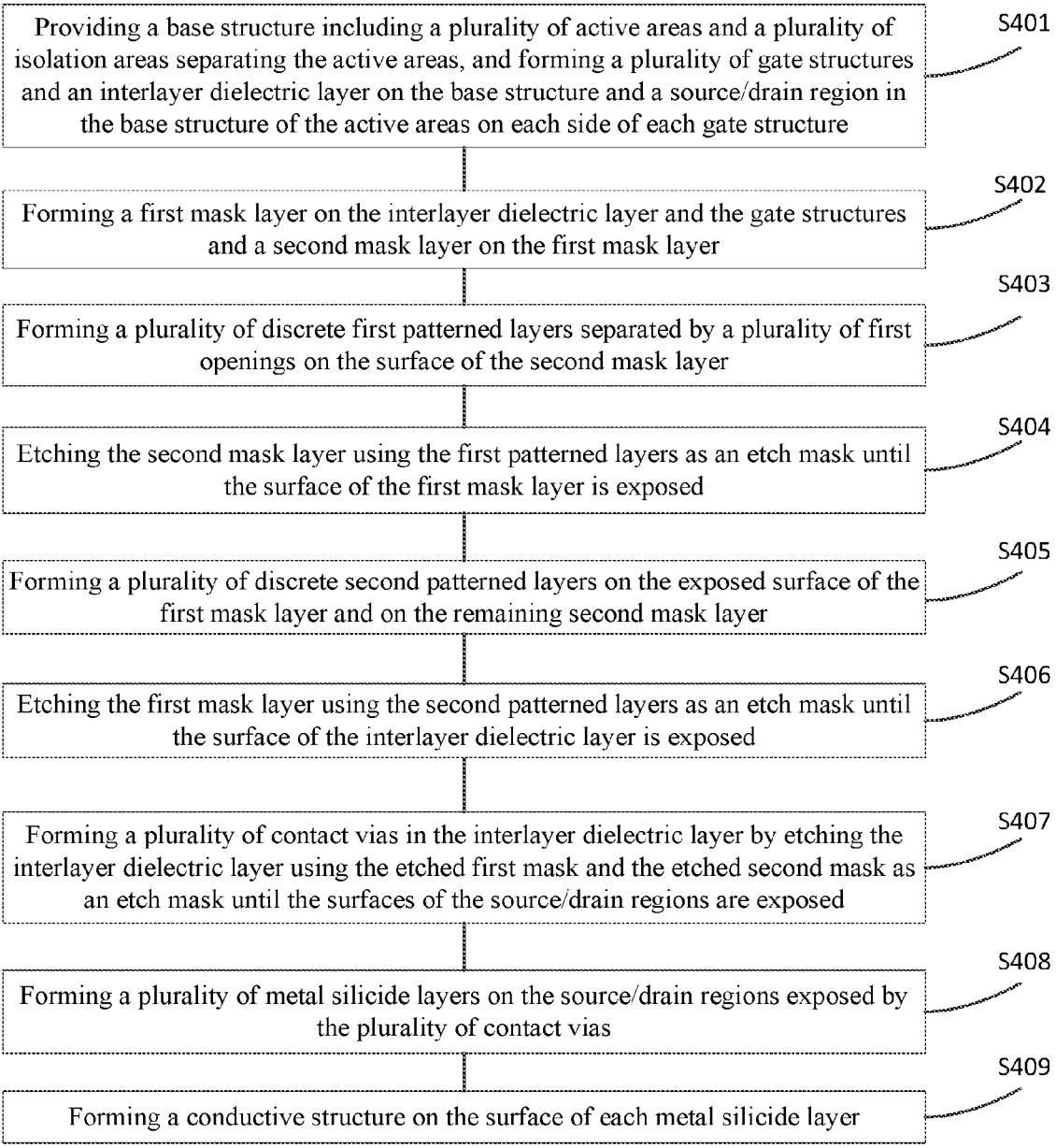
FIG. 18 illustrates a flowchart of an exemplary fabrication process consistent with disclosed embodiments of the present disclosure.

In view of the above problems, the present disclosure provides a fabrication method for a semiconductor device. FIG. 18 shows a flowchart of an exemplary fabrication process consistent with disclosed embodiments. FIGS. 2-17 show schematic views of semiconductor structures at certain stages of the exemplary fabrication process.

Figure 1:
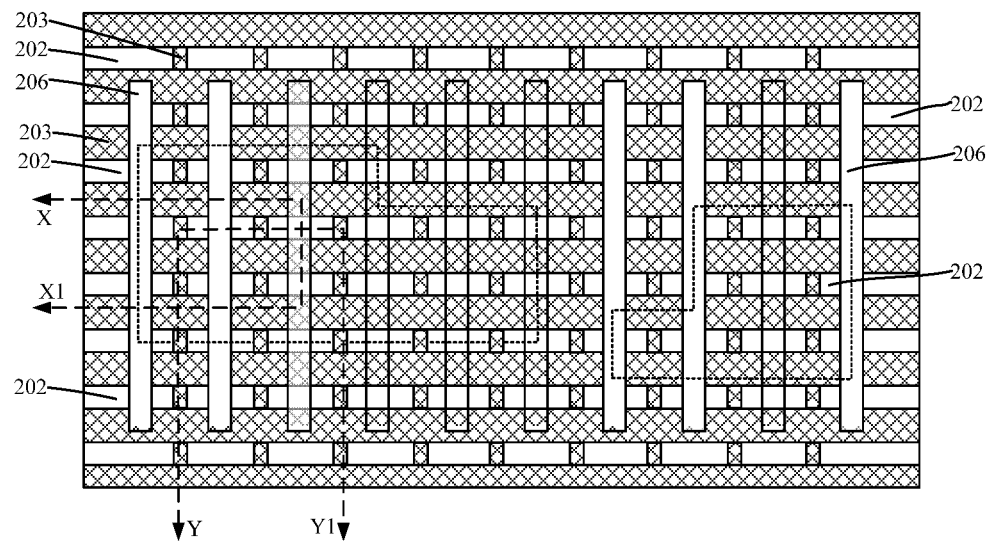
FIGS. 1-17 illustrate schematic views of semiconductor structures corresponding to certain stages of an exemplary fabrication method consistent with disclosed embodiments of the present disclosure.
Figure 2:
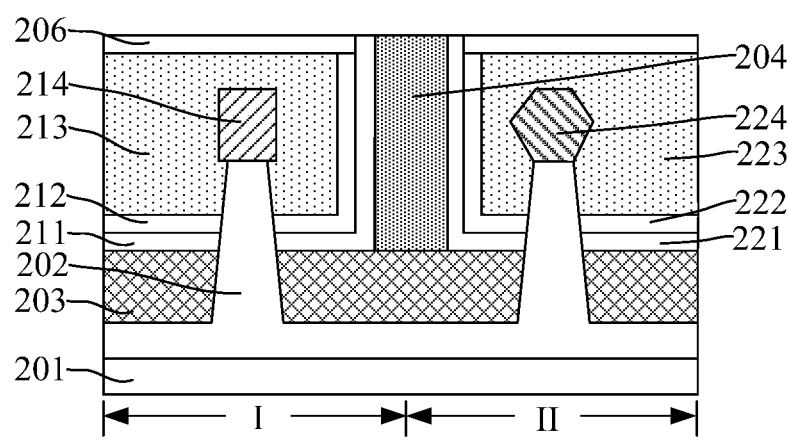

Referring to FIG. 18, at the beginning of the fabrication process, a base structure including a plurality of active areas and a plurality of isolation areas may be provided (S401). FIG. 1 shows a schematic top view of the corresponding semiconductor structure. FIG. 2 shows a cross-section view of the semiconductor structure shown in FIG. 1 along an XX1 line and FIG. 3 shows a cross-section view of the semiconductor structure shown in FIG. 1 along a YY1 line.

Figure 3:
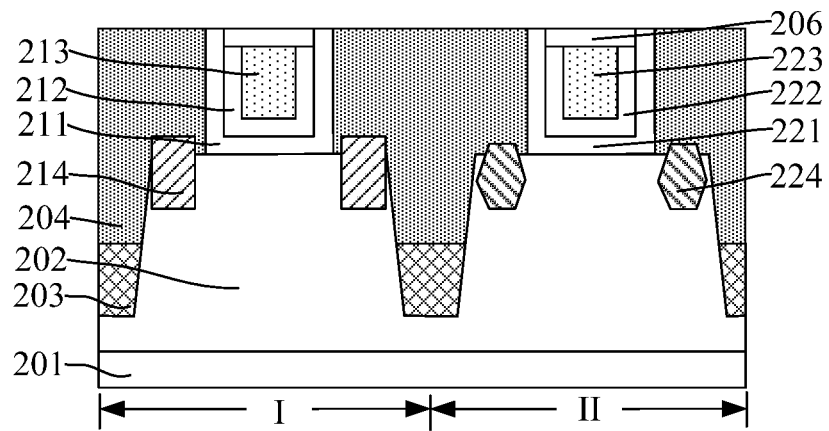

Referring to FIGS. 1-3, a base structure including a plurality of active areas (not labeled) and a plurality of isolation areas (not labeled) may be provided. The plurality of isolation areas may separate neighboring active areas. A plurality of gate structures may be formed on the surface of the base structure. A source region (not labeled) and a drain region (not labeled) may be formed in the base structure on the two sides of each gate structure. Further, an interlayer dielectric layer 204 may be formed on the surface of the base structure and the surfaces of the gate structures (referring to FIGS. 2-3).

For ease of illustration, the interlayer dielectric layer 204, the source regions, and the drain regions are not shown in the top view of the semiconductor structure shown in FIG. 1. A first source/drain region and a second source/drain region are shown in FIG. 2; while a first source region, a first drain region, a second source region, and a second drain region are all shown in FIG. 3. Further, the dashed frames in FIG. 1 schematically indicate a number of device areas (not labeled) on the base structure. Each device area may include a plurality of active areas. In a subsequent process, contact vias may be formed in the device areas.

Further, a plurality of gate structures with corresponding source/drain regions may be formed in each active area of the base structure. An isolation layer 203 may be formed in the isolation areas. In one embodiment, the semiconductor device to be formed includes a plurality of Fin-FETs. Accordingly, the base structure may include a substrate 201, a plurality of discrete fin structures 202, and an isolation layer 203 formed on the surface of the substrate 201. The isolation layer 203 may cover a portion of sidewall surfaces of the fin structures 202 and the top of the isolation layer 203 may be lower than the top of the fin structures 202. The base structure may also include a plurality of gate structures. The gate structures may be formed across the fin structures 202. The gate structures may cover a portion of the top and sidewall surfaces of the fin structures 202 as well as a portion of the surface of the isolation layer 203.

In one embodiment, the number of the fin structures 202 formed on the base structure may be greater than one and the plurality of fin structures 202 may be arranged in parallel with each other. Each gate structure may be formed across at least one fin structure 202. Moreover, the number of the gate structures may also be greater than one and the plurality of gate structures may be arranged in parallel with each other. The extending direction of the gate structures may be perpendicular to the extending direction of the fin structures 202 and each gate structure may be formed across at least one fin structure 202.

The substrate 201 may be made of a material including silicon, germanium, SiGe, SiC, GaAs, InAs, etc. The substrate 201 may also be silicon on insulator (SOI), germanium on insulator (GOI) substrate. The fin structure 202 may be made of a material including silicon, germanium, SiGe, SiC, GaAs, InAs, etc. The isolation layer 203 may be used as an isolation structure in the semiconductor device to electrically isolate neighboring fin structures 202. The isolation layer 203 may be made of $SiO_x$, $SiN_x$, SiON, etc. In one embodiment, the substrate 201 is made of silicon, the fin structure 202 is also made of silicon, and the isolation layer 203 may be made of $SiO_x$.

In another embodiment, the semiconductor devices to be formed are planar transistors. Therefore, the base structure may be a planar substrate. The planar substrate may be made of silicon, germanium, SiGe, or SiC. The planar substrate may also be made of silicon on insulator (SOI), germanium on insulator (GOI), glass, or a Group III-V compound (such as GaN, GaAs, etc.). The plurality of gate structures may be formed on the surface of the planar substrate.

In one embodiment, the source/drain regions of each gate structure may include a source region and a drain region formed separately in the base structure of the active area on the two opposite sides of the gate structure. The source region may be used to form the source electrode of the semiconductor device and the drain region may be used to form the drain electrode of the semiconductor device. In one embodiment, the base structure includes a first region I and a second region II. Each of the first region I and the second region II may be an NMOS region or a PMOS region. For illustration purposes, in one embodiment, the semiconductor structure is described to have an NMOS region in the first region I and a PMOS region in the second region II. In addition, the gate structures may include a first gate structure formed on the surface of the base structure in the first region I and a second gate structure formed on the surface of the base structure in the second region II. Moreover, the source and the drain regions may include a first source region (not labeled) and a first drain region (not labeled) formed separately in the base structure on the two sides of the first gate structure and a second source region (not labeled) and a second drain region (not labeled) formed separately in the base structure on the two sides of the second gate structure.

In one embodiment, a first stress layer 214 may be formed in the first source region and the first drain region. The first stress layer 214 may be made of SiC and doped with N-type ions such as P, As, or Sb ions. A second stress layer 224 may be formed in the second source region and the second drain region. The second stress layer 224 may be made of SiGe and doped with P-type ions such as B, Ga, or In ions.

Further, the first gate structure may include a first gate dielectric layer 211, a first work function layer 212 formed on the surface of the first gate dielectric layer 211, and a first conductive gate electrode 213 formed on the surface of the first work function layer 212; the second gate structure may include a second gate dielectric layer 221, a second work function layer 222 formed on the surface of the second gate dielectric layer 221, and a second conductive gate electrode 223 formed on the surface of the second work function layer 222. The first gate structure may also include two first sidewall spacers (not shown) formed on the sidewall surfaces of the first gate dielectric layer 211, the first work function layer 212, and the first conductive gate electrode 213. The second gate structure may also include two second sidewall spacers (not shown) formed on the sidewall surfaces of the second gate dielectric layer 221, the second work function layer 222, and the second conductive gate electrode 223.

The first gate dielectric layer 211 may be made of a high-k dielectric material and the second gate dielectric layer 221 may also be made of a high-k dielectric material. The high-k dielectric material may include $HfO_2$, HfSiO, HfSiON, HfTaO, HfTiO, HfZrO, $ZrO_2$, $Al_2O_3$, etc. The first work function layer 212 may be made of an N-type work function material including TiAl, TaAlN, TiAlN, MoN, TaCN, AlN, etc. The second work function layer 222 may be made of a P-type work function material including Ta, TiN, TaN, TaSiN, TiSiN, etc. The first conductive gate electrode 213 may be made of one or more of Al, Cu, Ag, Au, Pt, Ni, Ti, W, etc. The second conductive gate electrode 223 may also be made of one or more of Al, Cu, Ag, Au, Pt, Ni, Ti, W, etc. In one embodiment, the first gate dielectric layer 211 is made of $HfO_2$, the second gate dielectric layer 221 is also made of $HfO_2$, the first work function layer 212 is made of TiAlN, the second work function layer 222 is made of TiN, the first conductive gate electrode 213 is made of W, and the second conductive gate electrode 223 is also made of W.

In one embodiment, a hard mask layer 206 may be formed to cover the top surface of the first conductive gate electrode 213 of the first gate structure and the top surface of the second conductive gate electrode 223 of the second gate structure. The hard mask layer 206 may provide protection for the top surfaces of the first conductive gate electrode 213 and the second conductive gate electrode 223. In one embodiment, the hard mask layer 206 may be made of $SiN_x$. In other embodiments, the hard mask layer 206 may also be made of SiON, SiCON, or any other appropriate material.

In other embodiments, the first gate structure and/or the second gate structure may also be dummy gate structures with a single layer or multiple layers.

The interlayer dielectric layer 204 may be used to electrically isolate the first gate structure from the second gate structure. In one embodiment, the hard mask layer 206 is formed on the first gate structure and the second gate structure to provide protection for the first conductive gate electrode 213 and the second conductive gate electrode 223. Therefore, the top surface of the interlayer dielectric layer 204 may be leveled with the top surfaces of the first gate structure and the second gate structure. In other embodiments, the top surface of the interlayer dielectric layer may be higher than the top surfaces of the first gate structure and the second gate structure. That is, the interlayer dielectric layer may cover the top surfaces of the first gate structure and the second gate structure.

The interlayer dielectric layer 204 may be made of one or more of $SiO_x$, $SiN_x$, SiON, etc. The interlayer dielectric layer 204 may be formed by a method including chemical vapor deposition (CVD), physical vapor deposition (PVD), and atomic layer deposition (ALD). In one embodiment, the interlayer dielectric layer 204 may be made of $SiO_x$ and formed by a method including plasma enhanced chemical vapor deposition (PECVD).

Figure 4:
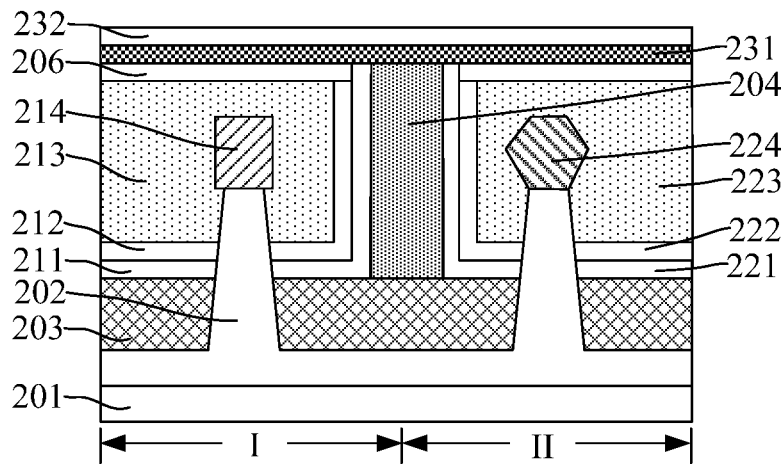
Figure 5:
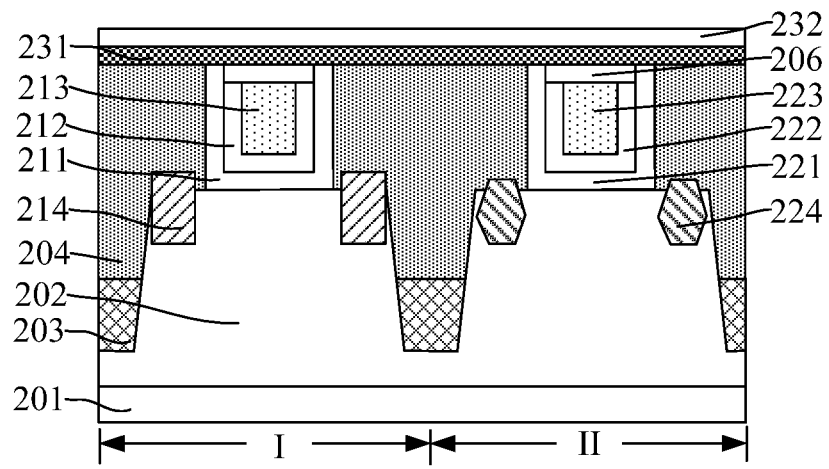

Further, returning to FIG. 18, a first mask layer may be formed on the surfaces of the interlayer dielectric layer and the gate structures, and a second mask layer may then be formed on the first mask layer (S402). FIGS. 4-5 show schematic cross-section views of the corresponding semiconductor structure. Specifically, FIG. 4 shows a schematic cross-section view developed from the view shown in FIG. 2, and FIG. 5 shows a schematic cross-section view developed from the view shown in FIG. 3.

Referring to FIGS. 4-5, a first mask layer 231 may be formed to cover the gate structures and the interlayer dielectric layer 204. Further, a second mask layer 232 may be formed on the surface of the first mask layer 231. The second mask layer 232 may be made of a material different from the material the first mask layer 231 made of.

The first mask layer 231 and the second mask layer 232 may be made of different materials so that the etch rate on the first mask layer 231 and the etch rate on the second mask layer 232 may be different during a subsequent etching process. The first mask layer 231 may be made of one or more of $SiO_x$, $SiN_x$, SiON, SiCN, SiCON, TiN, TaN, etc. The second mask layer 232 may be made of one or more of $SiO_x$, $SiN_x$, SiON, SiCN, SiCON, TiN, TaN, etc., but may not be made of the same material used for forming the first mask layer 231.

In a subsequent process, contact vias to expose the first source region and the first drain region and also to expose the second source region and the second drain region may be formed by etching the interlayer dielectric layer 204 using the patterned first mask layer 231 as an etch mask. Moreover, in order to improve the etch selectivity (e.g., ratio of etch rates) between the etch rate on the interlayer dielectric layer 204 and the etch rate on the first mask layer 231 during the subsequent etching process and also ensure the desired morphology of the formed contact vias, the first mask layer 231 may be made of TiN or TaN, and the second mask layer 232 may be made of $SiO_x$, $SiN_x$, SiON, SiCN, or SiCON.

In one embodiment, the first mask layer 231 may be made of TiN and the thickness of the first mask layer 231 may be in a range of 10 Å to 500 Å; and the second mask layer 232 may be made of $SiO_x$ and the thickness of the second mask layer 232 may be in a range of 10 Å to 500 Å.

Figure 6:
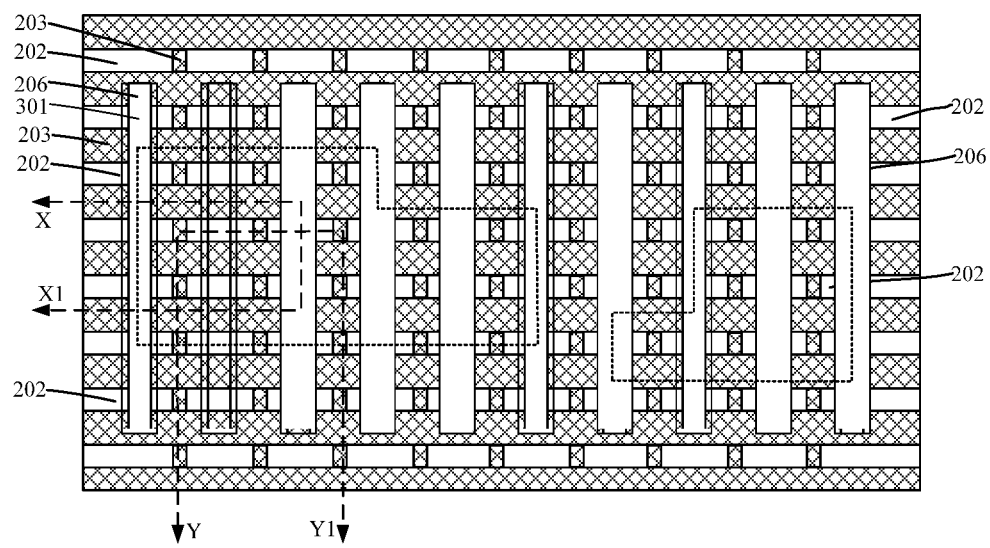
Figure 7:
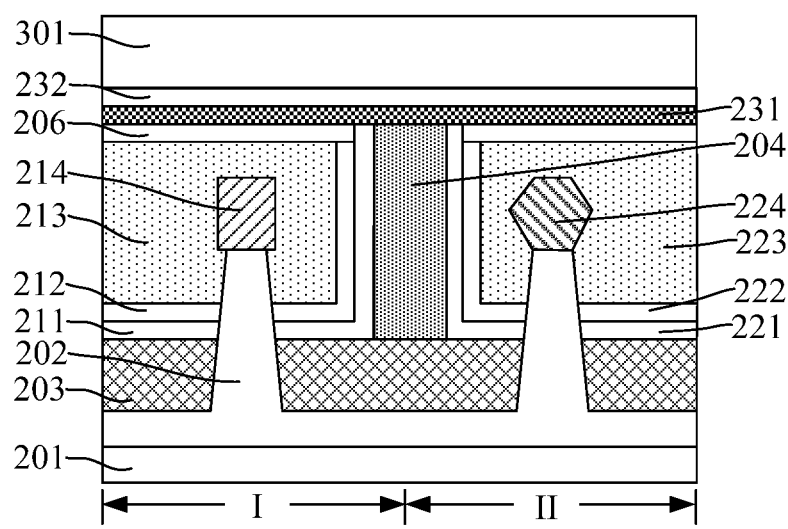
Figure 8:
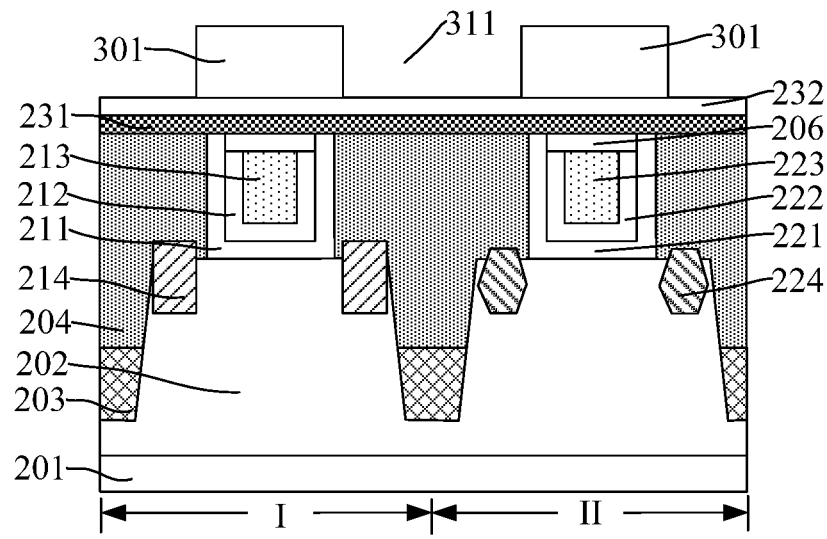

Further, returning FIG. 18, a plurality of discrete first patterned layers separated by a plurality of first openings may be formed on the surface of the second mask layer (S403). FIG. 6 shows a schematic top view of the corresponding semiconductor structure. For illustration purposes, the first mask layer 231 and the second mask layer 232 are not labeled in the schematic top view of the semiconductor structure shown in FIG. 6. FIG. 7 shows a schematic cross-section view of the semiconductor structure shown in FIG. 6 along the XX1 line; that is, FIG. 7 shows a schematic cross-section view developed from the view shown in FIG. 4. FIG. 8 shows a schematic cross-section view of the semiconductor structure shown in FIG. 6 along the YY1 line; that is, FIG. 8 shows a schematic cross-section view developed from the view shown in FIG. 5.

Referring to FIGS. 6-8, a plurality of discrete first patterned layers 301 may be formed on the surface of the second mask layer 232. The projected pattern of the first patterned layers 301 on the top surfaces of the gate structures may cover at least the top surfaces of the gate structures. A plurality of first openings 311 may be formed between neighboring first patterned layers 301. Each first opening 311 may be formed across a source region, a drain region, and a portion of the isolation area between the source region and the drain region. That is, the width of the first opening 311 may be greater than or equal to the total width of a source region, a drain region, and a portion of the isolation area between the source region and the drain region.

In one embodiment, the plurality of first patterned layers 301 may be arranged in parallel with each other. The first patterned layers 301 may be arranged perpendicular to the extending direction of the fin structures 202, but may be in parallel with the extending direction of the gate structures. The first openings 311 may all have a stripe-shaped top view. The first openings 311 may be formed vertically above the corresponding portion of the isolation layer 203 and also covering the source region and the drain region next to the portion of the isolation layer 203.

In one embodiment, the first patterned layers 301 may all have a stripe shape and the first openings 311 may also have a stripe shape. The first patterned layers 301 may cover at least the entire top surface of the first gate structure and the entire top surface of the second gate structure. Therefore, the projected pattern of the first patterned layers 301 on the top surface of the first gate structure may cover at least the top surface of the first gate structure and the projected pattern of the first patterned layers 301 on the top surface of the second gate structure may cover at least the top surface of the second gate structure.

In one embodiment, in order to prevent subsequently-formed metal silicide layers from electrically connecting with the first gate structure and the second gate structure, the area size of the projected pattern of the first patterned layers 301 on the top surface of the first gate structure may be larger than the area size of the top surface of the first gate structure and the area size of the projected pattern of the first patterned layers 301 on the top surface of the second gate structure may be larger than the area size of the top surface of the second gate structure. As such, the sidewalls of the subsequently formed contact vias may not expose the sidewall surfaces of the first gate structure and the second gate structure. Specifically, along the arranged direction of the plurality of first patterned layers 301, the dimension of the first gate structure may be less than the dimension of the corresponding first patterned layer 301 and the dimension of the second gate structure may also be less than the dimension of the corresponding first patterned layer 301.

The number of the fin structures 202 may be more than one, the first openings 311 may be formed across the source/drain regions of at least one fin structure 202. Referring to FIG. 8, in one embodiment, the first openings 311 formed between neighboring first patterned layers 301 may be vertically above the first/drain regions and the second source/drain regions. In addition, the first openings 311 may also be vertically above a portion of the isolation layer 203 between neighboring fin structures 202. Each first opening 311 may be formed across at least the first source/drain region or the second source/drain region.

In one embodiment, the first patterned layers 301 may be made of a photoresist material. The formation process for the plurality of first patterned layers 301 may include the following steps. First, a photoresist film may be formed on the surface of the second mask layer 232 by a spin-coating method. Then, an exposure and development process may be performed on the photoresist film to form the plurality of first patterned layers 301.

The morphology of the sidewalls of the first patterned layers 301 may affect the morphology of the sidewalls of the subsequently-formed contact vias, and thus may affect the boundary morphology of the subsequently-formed metal silicide layers. Because the dimensions of the first patterned layers 301 may be relatively large and the distance between neighboring first patterned layers 301 may also be large, the first patterned layers 301 formed by a photolithography process may not be affected by the limitations of the photolithography process. As such, the position accuracy and the morphology accuracy of first patterned layers 301 may be desired. Therefore, contact vias formed subsequently in the interlayer dielectric layer 204 may also have desired position accuracy and morphology accuracy, and thus the morphology of the subsequently-formed metal silicide layers may be improved.

Figure 9:
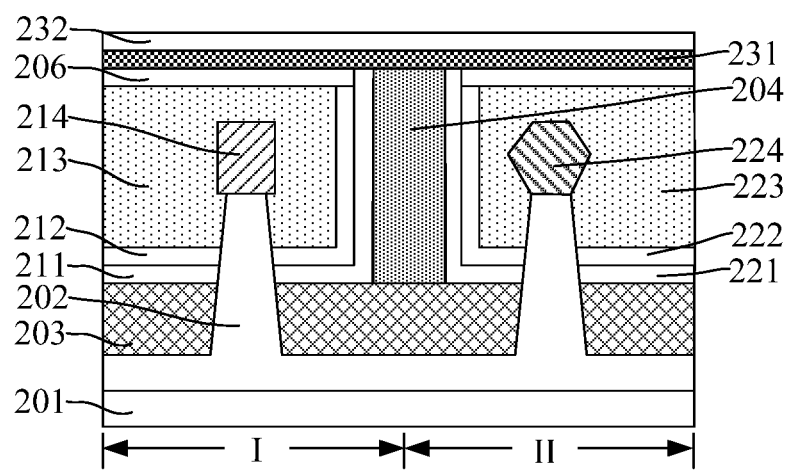
Figure 10:
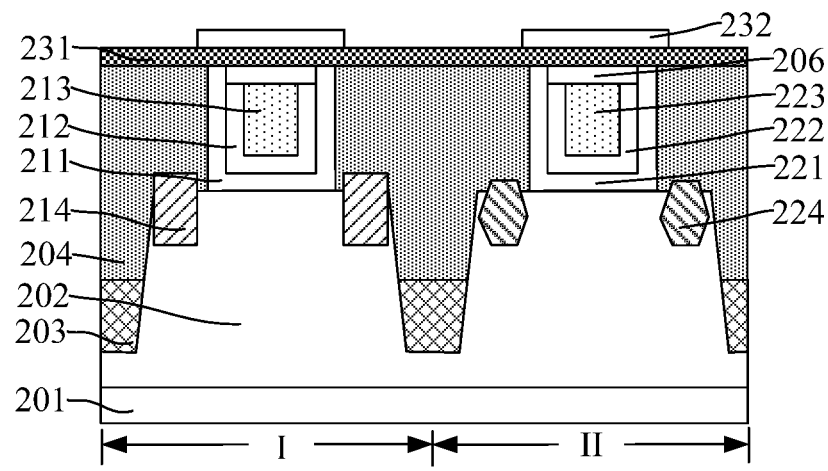

Further, returning to FIG. 18, an etching process may be performed to etch the second mask layer using the first patterned layers as an etch mask until the surface of the first mask layer is exposed (S404). FIGS. 9-10 show schematic cross-section views of the corresponding semiconductor structure. Specifically, FIG. 9 shows a schematic cross-section view developed from the view shown in FIG. 7 and FIG. 10 shows a schematic cross-section view developed from the view shown in FIG. 8.

Referring to FIGS. 9-10, the second mask layer 232 may be etched by using the first patterned layers 301 (referring to FIGS. 6-8) as an etch mask until the surface of the first mask layer 231 is exposed. In one embodiment, a dry etching process may be performed to etch the second mask layer 232. During the dry etching process, the first patterned layers 301 may be used as the etch mask so that the pattern of the first patterned layers 301 may be transferred into the second mask layer 232. Because the first mask layer 231 and the second mask layer 232 may be formed by different materials, the etch rate on the second mask layer 232 during the dry etching process may be larger than the etch rate on the first mask layer 231.

Further, the first patterned layers 301 may be removed. The first patterned layers 301 may be removed by a wet etching process or by an ashing process.

Figure 11:
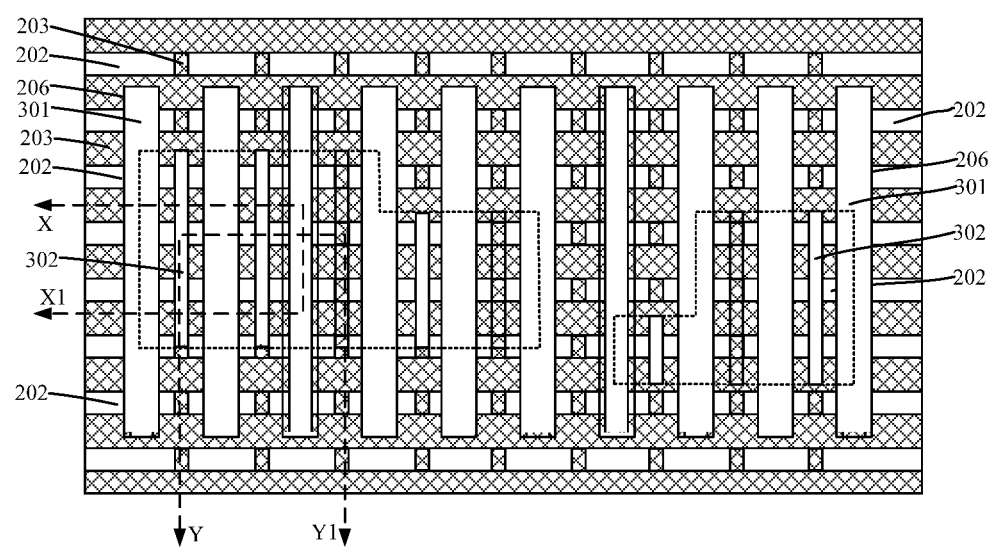
Figure 12:
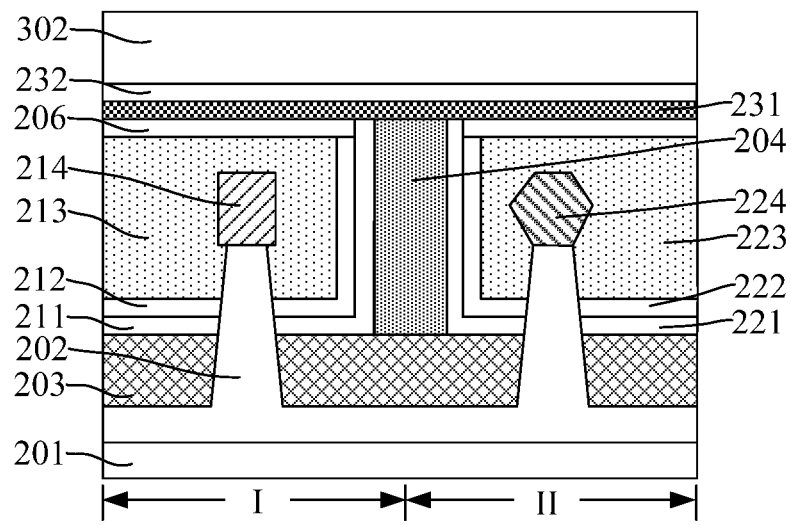
Figure 13:
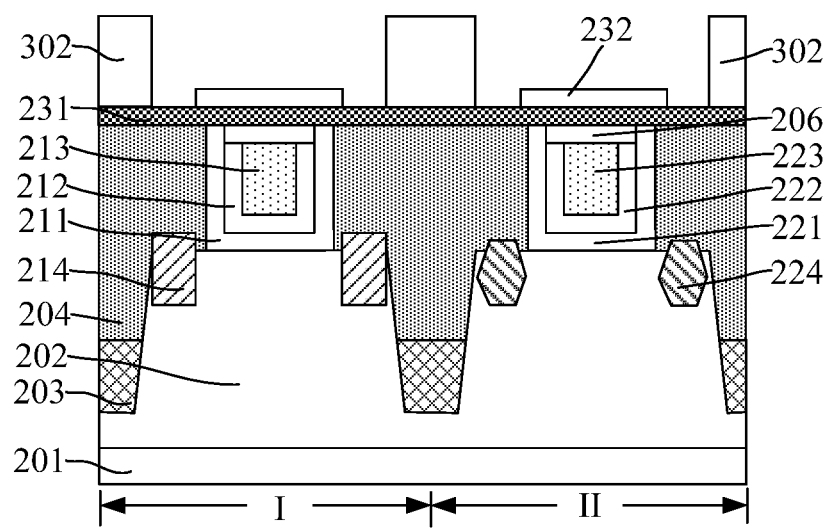

Returning to FIG. 18, further, a plurality of discrete second patterned layers may be formed on the exposed surface of the first mask layer and also on the surface of the remaining second mask layer (S405). FIG. 11 shows a schematic top view of the corresponding semiconductor structure. For illustration purposes, the first mask layer 231 and the second mask layer 232 are not labeled in FIG. 11, while the schematic top views of the first patterned layers 301 and the second patterned layers are shown in FIG. 11. FIG. 12 shows a schematic cross-section view of the semiconductor structure shown in FIG. 11 along the XX1 line; that is, FIG. 12 shows a schematic cross-section view developed from the view shown in FIG. 9. FIG. 13 shows a schematic cross-section view of the semiconductor structure shown in FIG. 11 along the YY1 line; that is, FIG. 13 shows a schematic cross-section view developed from the view shown in FIG. 10.

Referring to FIGS. 11-13, after the etching process to transfer the pattern of the first patterned layers 301 (referring to FIGS. 7-8) into the second mask layer 232, a plurality of discrete second patterned layers 302 may be formed on the exposed portion of the first mask layer 231 and the remaining second mask layer 232. The plurality of second patterned layers 302 may be formed vertically above the isolation areas between neighboring source and drain regions. The areas exposed by the second patterned layers 302 may be the same as the active areas. In one embodiment, the second patterned layers 302 may only be formed in the device areas in order to save production cost.

In one embodiment, the plurality of second patterned layers 302 may be arranged in parallel with each other. The second patterned layers 302 may all have a stripe-shaped top view. The second patterned layers 302 may be formed vertically above the isolation layer 203 formed between neighboring source region and drain region.

The areas exposed by the second patterned layers 302 may be situated vertically above the active areas. Therefore, the area exposed by the second patterned layers 302 in the first region I may be vertically above the first gate structure as well as the first source region and the first drain region; while the area exposed by the second patterned layers 302 in the second region II may be vertically above the second gate structure as well as the second source region and the second drain region. In addition, the second patterned layers 302 may be formed vertically above a portion of the isolation layer 203.

In one embodiment, the second patterned layers 302 may be made of a photoresist material. The formation process for the plurality of second patterned layers 302 may include the following steps. First, a photoresist film may be formed on the surfaces of the exposed first mask layer 231 and the remaining second mask layer 232 by a spin-coating method. Then, an exposure and development process may be performed on the photoresist film to form the plurality of second patterned layers 302.

The morphology of the sidewalls of the second patterned layers 302 may affect the morphology of the sidewalls of the subsequently-formed contact vias, and thus may affect the boundary morphology of the subsequently-formed metal silicide layers. Because the dimensions of the second patterned layers 302 are relatively large and the distance between neighboring second patterned layers 302 may also be large, the second patterned layers 302 formed by a photolithography process may not be affected by the limitations of the photolithography process. As such, the position accuracy and the morphology accuracy of second patterned layers 302 may be desired. Therefore, contact vias subsequently formed in the interlayer dielectric layer 204 using the second patterned layers 302 as an etch mask may also have desired position accuracy and morphology accuracy, and thus the morphology of the subsequently-formed metal silicide layers may be improved.

In the meantime, the boundary morphology of the formed metal silicide layers may be related to the sidewall morphology of the first patterned layers 301 or the sidewall morphology of the second patterned layers 302. Moreover, alignment between the patterns of the first patterned layers 301 and the second patterned layers 302 may not need to be considered. Therefore, the fabrication method may avoid the overlay issue in aligning the first patterned layers 301 with the second patterned layers 302 and may also avoid the line end issue. Thus, the morphology of the subsequently-formed contact vias may be desired.

According to existing fabrication methods, patterns of the first patterned layers and the second patterned layers may need to be aligned. Therefore, overlay issue and line end issue may occur during the alignment process for the patterns, and thus the morphology of the formed contact vias may not be desired, which further leads to poor morphology for the subsequently-formed metal silicide layers.

Figure 14:
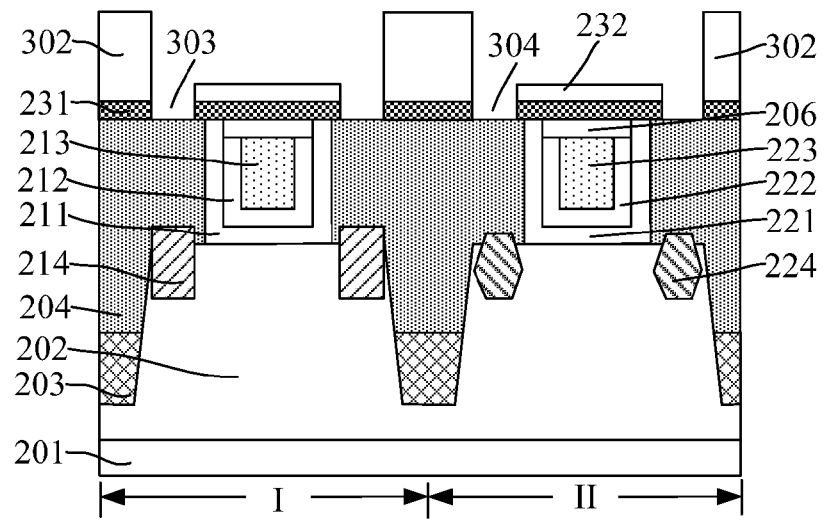

Further, returning to FIG. 18, an etching process may be performed on the first mask layer using the second patterned layers as an etch mask until the top surface of the interlayer dielectric layer is exposed (S406). FIG. 14 shows a schematic cross-section view of the corresponding semiconductor structure. Specifically, the cross-section view shown in FIG. 14 is developed from the view shown in FIG. 13.

Referring to FIG. 14, an etching process may be performed on the first mask layer using the second patterned layers 302 as an etch mask until the top surface of the interlayer dielectric layer 204 is exposed. Two first trenches 303 may then be formed in the first mask layer 231 in the first region I and two second trenches 304 may be formed in the first mask layer 231 in the second region II.

In one embodiment, a dry etching process may be performed to etch the exposed portion of the first mask layer 231 until the surface of the interlayer dielectric layer 204 is exposed.

A first trench 303 may be formed vertically above the source region or the drain region in the first region I. The first trench 303 in the first region I may be formed across the source/drain regions of at least one fin structure 202, and the second trench 304 in the second region II may be formed across the source/drain regions of at least one fin structure 202.

In one embodiment, the first trench 303 may be formed across a plurality of first source/drain regions along the extending direction of the second patterned layers, and the second trench 304 may be formed across a plurality of second source/drain regions along the extending direction of the second patterned layers.

According to the disclosed fabrication method, the position accuracy and the morphology accuracy of the first patterned layers 301 and the second patterned layers 302 may be obtained. In addition, the boundary morphology of the first trench 303 and the second trench 304 may be related to either the morphology of the sidewall of the first patterned layers 301 or the morphology of the sidewall of the second patterned layers 302. In addition, alignment between the patterns of the first patterned layers 301 and the second patterned layers 302 and the line end issue may not need to be considered. Therefore, the fabrication method may avoid the overlay issue in aligning the first patterned layers 301 with the second patterned layers 302, and may also avoid the line end issue and the corner rounding issue. Thus, position accuracy and morphology accuracy of the first trench 303 and the second trench 304 may be desired.

Further, the second patterned layers 302 may be removed. The second patterned layers 302 may be removed by a wet etching process or by an ashing process.

Figure 15:
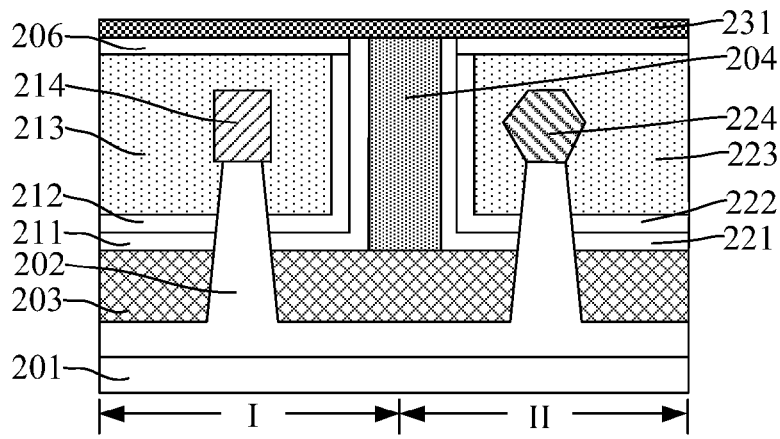
Figure 16:
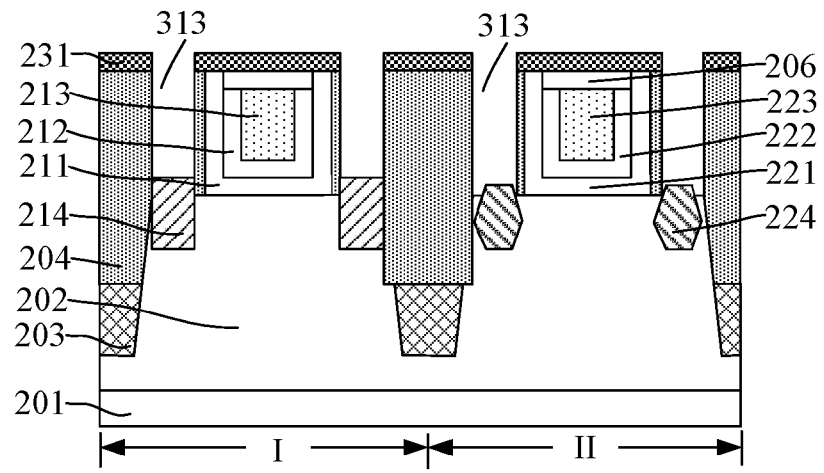

Returning to FIG. 18, after performing the etching process on the first mask layer, the interlayer dielectric layer may further be etched using the first mask layer as an etch mask until the surfaces of the source region and the drain region are exposed (S407). FIGS. 15-16 shows schematic cross-section views of the corresponding semiconductor structure. FIG. 15 shows a schematic cross-section view developed from the view shown in FIG. 12 and FIG. 16 shows a schematic cross-section view developed from the view shown in FIG. 14.

Referring to FIGS. 15-16, an etching process may be performed on the interlayer dielectric layer 204 using the etched first mask layer 231 as an etch mask until the top surfaces of the source and the drain regions are exposed. After the etching process, a plurality of contact vias 313 may be formed in the interlayer dielectric layer 204 on each of the source/drain regions.

Specifically, a plurality of contact vias 313 may be formed in the interlayer dielectric layer 204 in the first region I by etching the interlayer dielectric layer 204 along the first trench 303 (referring to FIG. 13). The contact vias in the first region I may expose the surfaces of the first source region and the first drain region. In the meantime, a plurality of contact vias 313 may also be formed in the interlayer dielectric layer 204 in the second region II by etching the interlayer dielectric layer 204 along the second trench 304 (referring to FIG. 13). The contact vias in the second region II may expose the surfaces of the second source region and the second drain region.

In one embodiment, a dry etching process may be performed to etch the interlayer dielectric layer 204 to form the plurality of contact vias 313 in the first region I and the second region II.

Further, the first mask layer 231 may be made of TiN, the second mask layer 232 (referring to FIG. 13) may be made of $SiO_x$, and the interlayer dielectric layer 204 may be made of $SiO_x$. Therefore, during the etching process performed on the interlayer dielectric layer 204 using the first mask layer 231 as the etch mask, the second mask layer 232 may also be removed. In addition, for the etching process, the selective etch ratio between the etch rate on the interlayer dielectric layer 204 and the etch rate on the first mask layer 231 may be large so that the morphology of the formed contact vias 313 may be desired.

Each contact via 313 may be formed over the first source/drain region or the second source/drain region of at least one fin structure 202. In one embodiment, the contact vias 313 may be formed vertically above a plurality of first source/drain regions or second source/drain regions and may expose the top surfaces of the plurality of first source/drain regions or the top surfaces of the plurality of second source/drain regions. In addition, during the etching process to form contact vias 313, a portion of the interlayer dielectric layer 204 formed between neighboring first source and drain regions or between neighboring second source and drain regions may also be removed. Therefore, the contact vias 313 may also expose the interlayer dielectric layer 204 formed between neighboring first source and drain regions or between neighbor second source and drain regions.

In one embodiment, the plurality of contact vias 313 may expose the entire top surfaces of the first source and drain regions and the entire top surfaces of the second source and drain regions. In other embodiments, the contact vias may expose a portion of the top surfaces of the first source/drain regions and a portion of the top surface of the second source/drain regions.

According to the disclosed fabrication method, the boundary morphology of the contact vias 313 may be related to either the sidewall morphology of the first patterned layers 301 or the sidewall morphology of the second patterned layers 302. The first patterned layers 301 and the second patterned layers 302 may both have relatively high position accuracy and morphology accuracy. Moreover, alignment between the patterns of the first patterned layers 301 and the second patterned layers 302 may not need to be considered. Therefore, the fabrication method may avoid the overlay issue in aligning the first patterned layers 301 with the second patterned layers 302; in addition, the fabrication method may also avoid the line end issue and the corner rounding issue. As such, the subsequently-formed contact vias 313 may have high position accuracy and morphology accuracy. Further, the contact vias 313 may not be significantly affected by the continuous reduction of the process node. Therefore, the process flexibility may be improved so that the morphology of the sidewalls of the contact vias 313 may be desired and the contact vias 313 may have relatively high position accuracy and morphology accuracy.

Further, returning to FIG. 18, a metal silicide layer may be formed on the surface of the source/drain region exposed by each contact via (S408). FIG. 17 shows a schematic cross-section view of the corresponding semiconductor structure. The cross-section view shown in FIG. 17 is developed from the view shown in FIG. 16.

Referring to FIG. 17, a plurality of discrete metal silicide layers 314 may be formed on the surface of the source/drain regions exposed by the contact vias 313. In one embodiment, the plurality of metal silicide layer 314 may be formed on the surfaces of the first source/drain regions and the second source/drain regions. The metal silicide layers 314 may be formed across the first source/drain region or the second source/drain region in at least one fin structure 202. In a subsequent process, conductive structures may be formed on the surfaces of the first source/drain regions and the second source/drain regions. The metal silicide layer 314 may be conducive to reducing the contact resistance between each conductive structure and the corresponding first source/drain region or the corresponding second source/drain region.

In one embodiment, the plurality of metal silicide layers 314 may be made of NiSi. The metal silicide layers 314 may be formed by a method including the following steps. First, a nickel layer may be formed on the surface of the first mask layer 231 and the bottom and sidewall surfaces of each contact via 313. Then, an annealing process may be performed on the nickel layer to allow the nickel atoms in the nickel layer react with the silicon atoms in the first source/drain regions and also in the second source/drain regions. After the annealing process, a plurality of discrete metal silicide layer 314 may be formed on the surfaces of the first source/drain regions and the second source/drain regions. Finally, the remaining nickel layer may then be removed.

According to the disclosed fabrication method, the contact vias 313 may have desired position accuracy and morphology accuracy. Therefore, the metal silicide layers 314 formed on the bottom surfaces of the contact vias 313 may also have desired morphology and high position accuracy. Specifically, one boundary of each metal silicide layer 314 may be related to the morphology of the sidewall of the corresponding first patterned layer 301 and the other boundary of the metal silicide layer 314 may be related to the morphology of the sidewall of the corresponding second patterned layer 302. Thus, by improving the morphology accuracy of the first patterned layer 301 and the second patterned layer 302, the overlay issue, the line end issue, and the corner rounding issue may all be avoided or reduced. Therefore, the boundary morphology of the metal silicide layers 314 may be improved, and thus the electrical properties of the metal silicide layers may be improved and the electrical performance of the subsequently-formed semiconductor device may also be improved.

Returning to FIG. 18, further, a conductive structure may be formed on the surface of each metal silicide layer (S409). The conductive structure may be made of Cu, W, Al, or any other appropriate conductive metal or their alloy(s).

According to the disclosed fabrication method, the pattern of the first patterned layers 301 may be transferred into the second mask layer 232 so that a portion of the first mask layer 231 corresponding to the pattern of the first patterned layers 301 may be exposed. Then, the pattern of the second patterned layers 302 may be transferred into the first mask layer 231 to form the patterned first mask layer 231. The contact vias 313 may then be formed by etching the interlayer dielectric layer 204 using the patterned first mask layer 231 as the etch mask.

In other embodiments, transferring the pattern of the first patterned layers and transferring the pattern of the second patterned layers may be exchangeable. That is, the pattern of the second patterned layers may be transferred into the second mask layer and the pattern of the first patterned layers may then be transferred into the first mask layer to form the patterned first mask layer. Further, the contact vias may be formed by etching the interlayer dielectric layer using the patterned first mask layer as an etch mask.

Specifically, the fabrication method may include the following steps. First, a base structure including a plurality of active areas and a plurality of isolation areas may be provided. The plurality of isolation areas may separate the plurality of active areas. A plurality of gate structures may be formed on the surface of the base structure. A source region and a drain region may be formed in the base structure of the active area on the two sides of each gate structure. An interlayer dielectric layer may be formed on the surface of the base structure. The interlayer dielectric layer may cover the sidewall surfaces of the gate structures.

Further, a first mask layer may be formed on the surfaces of the gate structures and the interlayer dielectric layer, and a second mask layer may be formed on the surface of the first mask layer. The first mask layer and the second mask layer may be made of different materials.

Then, a plurality of discrete second patterned layers may be formed on the surface of the second mask layer. The second patterned layers may be formed vertically above the isolation areas between neighboring source/drain regions. The areas exposed by the second patterned layers may be the same as the active areas. Further, an etching process may be performed to etch the second mask layer using the second patterned layers as an etch mask until the surface of the first mask layer is exposed. The plurality of second patterned layers may then be removed.

A plurality of discrete first patterned layers may then be formed on the exposed portion of the first mask layer and the remaining portion of the second mask layer. The projected pattern of the first patterned layers on the top surfaces of the gate structures may cover at least the top surfaces of the gate structures. A plurality of first openings may be formed between neighboring first patterned layers. Each first opening may be formed across a source region, a drain region, and a portion of the isolation area formed between the source region and the drain region. Further, an etching process may be performed to etch the first mask layer using the first patterned layers as an etch mask until the top surface of the interlayer dielectric layer is exposed. The plurality of first patterned layers may then be removed.

An etching process may then be performed to etch the interlayer dielectric layer using the patterned first mask layer as an etch mask until the top surfaces of the source regions and the drain regions are exposed. As such, a plurality of contact vias may be formed in the interlayer dielectric layer.

Finally, a plurality of metal silicide layers may be formed on the surfaces of the source regions and the drain regions exposed in the plurality of contact vias.

Moreover, in one embodiment, an isolation layer may be formed in the isolation areas and the second patterned layers may be formed vertically above a portion of the isolation layer between neighboring source and drain regions.

The base structure may further include a substrate, a plurality of discrete fin structures formed on the surface of the substrate, and the isolation layer formed on the surface of the substrate. The isolation layer may cover a portion of the sidewall surfaces of the fin structures and the top surface of the isolation layer may be lower than the top surface of the fin structures.

Further, each gate structure on the base structure may be formed across a corresponding fin structure and may cover a portion of the surface of the isolation layer and the sidewall and top surfaces of the fin structure. The source region and the drain region of each gate structure may be formed in the corresponding fin structure on the two sides of the gate structure. The isolation layer formed on the base structure may separate neighboring active areas.

Moreover, each first opening may be formed vertically above a portion of the isolation layer between a source region and a drain region. The first opening may also cover the source region and the drain region next to the portion of the isolation layer.

The first mask layer may be made of $SiO_x$, $SiN_x$, SiON, SiCON, TiN, or TaN. The second mask layer may be made of $SiO_x$, $SiN_x$, SiON, SiCON, TiN, or TaN, but may not be made of the same material used for forming the first mask layer.

The fabrication process for the first mask layer and the second mask layer may be similar to the fabrication process for the first mask layer 231 (referring to FIGS. 4-5) and the second mask layer 232 (referring to FIGS. 4-5) in the embodiment described above. In addition, the fabrication process for the first patterned layers may also be similar to the fabrication process for the first patterned layers 301 (referring to FIGS. 6-8) in the embodiment described above. Moreover, the fabrication process for the second patterned layers may also be similar to the fabrication process for the second patterned layers 302 (referring to FIGS. 11-13) in the embodiment described above.

The present disclosure also provides a semiconductor device. The semiconductor device may include a base structure. The base structure may further include a substrate, a plurality of discrete fin structures formed on the surface of the substrate, and an isolation layer formed on the surface of the substrate. The isolation layer may cover a portion of the sidewall surfaces of the fin structures and the top surface of the isolation layer may be lower than the top surface of the fin structures. The isolation layer formed on the base structure may separate neighboring active areas.

Further, the semiconductor device may include a gate structure formed on the base structure across each fin structure. The gate structure may cover a portion of the surface of the isolation layer and the sidewall and top surfaces of the fin structure. Each gate structure may include a gate dielectric layer formed on a portion of the top and sidewall surfaces of the corresponding fin structure, a work function layer formed on the surface of the gate dielectric layer, and a conductive gate electrode formed on the surface of the work function layer. The semiconductor device may also include a source region and a drain region formed in each fin structure on the two sides of the corresponding gate structure.

The semiconductor device may include an interlayer dielectric layer formed on the surface of the isolation layer and a portion of the sidewall and the top surfaces of the fin structures. The sidewall surfaces of the plurality of gate structures may be surrounded by the interlayer dielectric layer. The top surface of the interlayer dielectric layer may be leveled with the top surfaces of the gate structures.

The semiconductor device may further include a plurality of conductive structures formed in the interlayer dielectric layer above each source/drain region. Each conductive structure may be electrically connected to the corresponding source/drain region through a metal silicide layer formed on the surface of the source/drain region. The metal silicide layers and the conductive structures may be formed by filling a plurality of contact vias above the source/drain regions. The metal silicide layers may be made of nickel silicide ($Ni_2Si$) and the conductive structures may be made of Cu, W, Al, or any other appropriate conductive metal or their alloy(s).

The plurality of contact vias may be formed in the interlayer dielectric layer above the source/drain regions. Specifically, the plurality of contact vias may be formed by a method including the following steps.

First, a first mask layer may be formed on the surfaces of the gate structures and the interlayer dielectric layer, and a second mask layer may be formed on the surface of the first mask layer. The first mask layer and the second mask layer may be made of different materials.

Then, a plurality of discrete first patterned layers may then be formed on. The projected pattern of the first patterned layers on the top surfaces of the gate structures may cover at least the top surfaces of the gate structures. A plurality of first openings may be formed between neighboring first patterned layers. Each first opening may be formed across a source region, a drain region, and a portion of the isolation area between the source region and the drain region. Further, an etching process may be performed to etch the second mask layer using the first patterned layers as an etch mask until the top surface of the first mask layer is exposed. The plurality of first patterned layers may then be removed.

A plurality of discrete second patterned layers may be formed on the exposed portion of the first mask layer and the remaining portion of the second mask layer. The second patterned layers may be situated vertically above the isolation areas between neighboring source/drain regions and the areas exposed by the second patterned layers may be the same as the active areas. Further, an etching process may be performed to etch the first mask layer using the second patterned layers as an etch mask until the surface of the interlayer dielectric layer is exposed. The plurality of second patterned layers may then be removed.

An etching process may then be performed to etch the interlayer dielectric layer using the patterned first mask layer as an etch mask until the top surfaces of the source regions and the drain regions are exposed. As such, a plurality of contact vias may be formed in the interlayer dielectric layer.

Compared to existing semiconductor devices and fabrication methods, the disclosed semiconductor devices and fabrication methods may demonstrate several advantages.

For example, according to the disclosed semiconductor devices and fabrication methods, a first mask layer may be formed on the surfaces of the gate structures and a second mask layer may then be formed on the surface of the first mask layer. The first mask layer and the second mask layer may be made of different materials. A plurality of discrete first patterned layers may be formed on the surface of the second mask layer. The projected pattern of the first patterned layers onto the top surfaces of the gate structures may cover at least the top surfaces of the gate structures so that during the subsequent etching process to form contact vias, the etching process may not etch the gate structures. A plurality of first openings may be formed between neighboring first patterned layers. Each first opening may be formed across a source region, a drain region, and a portion of the isolation layer formed between the source region and the drain region. Therefore, the position and the morphology of the sidewalls of the first patterned layers may decide the position and the morphology of the sidewalls of the subsequently-formed contact vias. An etching process may then be performed to etch the second mask layer until the surface of the first mask layer is exposed. The plurality of first patterned layers may then be removed.

Further, a plurality of discrete second patterned layers may be formed on the exposed portion of the first mask layer and the remaining second mask layer. Each second patterned layer may be formed vertically above a portion of the isolation layer between neighboring source and drain regions. The areas exposed by the second patterned layers may be the same as the active areas. Therefore, the position and the morphology of the sidewalls of the second patterned layers may decide the position and the morphology of the sidewalls of the subsequently-formed contact vias. An etching process may be performed to etch the first mask layer using the second patterned layers as an etch mask until the surface of the interlayer dielectric layer is exposed. The plurality of first patterned layers may then be removed.

Further, an etching process may be performed to etch the interlayer dielectric layer using the patterned first mask layer as an etch mask until the surfaces of the source/drain regions are exposed. After the etching process, the plurality of contact vias may be formed in the interlayer dielectric layer above the source/drain regions.

According to the disclosed fabrication method, alignment between the patterns of the first patterned layers and the second patterned layers may not need to be considered. Therefore, the disclosed fabrication method may avoid the overlay issue, the line end issue, and the corner rounding issue.

Specifically, one boundary of each contact via may be related to the morphology of the sidewall of the corresponding first patterned layer and the other boundary of the contact via may be related to the morphology of the sidewall of the corresponding second patterned layer. Thus, by improving the morphology accuracy of the first patterned layer and the second patterned layer, the boundary morphology of the contact vias may be desired so that the subsequently-formed metal silicide layers may be improved. Therefore, the electrical properties of the metal silicide layers may be improved and the electrical performance of the subsequently-formed semiconductor device may also be improved.

Further, the first patterned layers may be arranged perpendicular to the extending direction of the fin structures but in parallel with the extending direction of the gate structures. As such, process challenges in forming the first patterned layers may be reduced, the position accuracy and the morphology accuracy of the first patterned layers may be improved, and thus the morphology of the contact vias may be further improved.

Moreover, the first mask layer may be made of TiN or TaN so that the selective etch ratio between the etch rate on the interlayer dielectric layer and the etch rate on the first mask layer may be relatively high, which may further improve the morphology of the ultimately-formed contact vias.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
    forming a plurality of gate structures on a base structure, a source/drain region in the base structure on each side of each gate structure, and an interlayer dielectric layer on the base structure to cover sidewall surfaces of the gate structures, wherein the plurality of gate structures are separated by a plurality of isolation areas;
    forming a first mask layer to cover the interlayer dielectric layer and the gate structures and a second mask layer to cover the first mask layer, wherein the second mask layer and the first mask layer are made of different materials;
    forming a plurality of first patterned layers separated by a plurality of first openings on the second mask layer, wherein a projected pattern of the plurality of first patterned layers covers at least top surfaces of the gate structures, and each first opening is formed across a source region, a drain region, and a portion of an isolation area between the source region and the drain region;
    forming a patterned second mask layer by etching the second mask layer using the plurality of first patterned layers as an etch mask until a portion of the first mask layer is exposed;
    forming a plurality of second patterned layers on an exposed portion of first mask layer and a remaining portion of the second mask layer, wherein the plurality of second patterned layers are formed vertically above the isolation areas between neighboring source and drain regions;
    forming a patterned first mask layer by etching the first mask layer using the plurality of second patterned layers as an etch mask until a portion of the interlayer dielectric layer is exposed;
    forming a plurality of contact vias to expose top surfaces of source/drain regions by etching the interlayer dielectric layer using the patterned first mask layer and the patterned second mask layer as an etch mask; and forming a plurality of metal silicide layers on the source/drain regions exposed in the plurality of contact vias.

2. The method for fabricating the semiconductor device according to claim 1, wherein:
an isolation layer is formed in the isolation areas;
each first opening is formed vertically above a source region, a neighboring drain region, and a portion of the isolation layer between the source region and the drain region; and
each second patterned layer is formed vertically above a portion of the isolation layer between a source region and a neighboring drain region.

3. The method for fabricating the semiconductor device according to claim 1, wherein the base structure further includes:
a substrate;
a plurality of discrete fin structures formed on the substrate; and
an isolation layer formed on the substrate covering a portion of sidewall surfaces of the fin structures, wherein:
a top surface of the isolation layer is lower than top surfaces of fin structures;
the gate structures are formed across the fin structures and cover a portion of the top surface of the isolation layer and top and sidewall surfaces of the fin structures; and
the source/drain regions are formed in the fin structures on both sides of the gate structures.

4. The method for fabricating the semiconductor device according to claim 3, wherein:
a number of the fin structures formed on the substrate is greater than one;
the plurality of fin structures are arranged in parallel with each other; and
each gate structure is formed across at least one fin structure.

5. The method for fabricating the semiconductor device according to claim 4, wherein:
the plurality of first patterned layers are arranged perpendicular to an extending direction of the fin structures; and
the first openings are formed across the source/drain regions of at least one fin structure.

6. The method for fabricating the semiconductor device according to claim 3, wherein
a number of gate structures is greater than one;
the plurality of gate structures are arranged in parallel with each other;
an extending direction of the gate structures is parallel to an extending direction of the plurality of first patterned layers;
the extending direction of the gate structures is parallel to an extending direction of the plurality of second patterned layers; and
each gate structure is formed across at least one fin structure.

7. The method for fabricating the semiconductor device according to claim 1, wherein:
the plurality of first patterned layers are formed in parallel with each other; and
the plurality of second patterned layers are formed in parallel with each other.

8. The method for fabricating the semiconductor device according to claim 1, wherein:
the first mask layer is made of one of $SiO_x$, $SiN_x$, SiON, SiCN, SiCON, TiN, and TaN; and
the second mask layer is made of one of $SiO_x$, $SiN_x$, SiON, SiCN, SiCON, TiN, and TaN.

9. The method for the semiconductor device according to claim 1, wherein:
the first mask layer is made of TiN or TaN; and
the second mask layer is made of $SiO_x$, $SiN_x$, SiON, SiCN, or SiCON.

10. The method for fabricating the semiconductor device according to claim 1, wherein:
a stress layer is formed in each source/drain region; and
the stress layer is made of SiC or SiGe.

11. The method for fabricating the semiconductor device according to claim 1, wherein forming the metal silicide layers further includes:
forming a metal layer to cover bottom and sidewall surfaces of the contact vias and the surface of the interlayer dielectric layer;
performing an annealing process on the metal layer to allow materials in the metal layer react with materials in the source/drain regions and form metal silicide layers; and
removing an unreacted portion of the metal layer.

12. The method for fabricating the semiconductor device according to claim 1, wherein:
the metal silicide layers are made of $Ni_2Si$.

13. The method for fabricating the semiconductor device according to claim 1, wherein:
the plurality of first patterned layers are made of photoresist;
the plurality of first patterned layers are formed by a method including:
forming a photoresist film on the second mask layer by a spin-coating method; and
performing an exposure and development process on the photoresist layer to form the plurality of first patterned layers.

14. The method for fabricating the semiconductor device according to claim 1, wherein:
the plurality of second patterned layers are made of photoresist;
the plurality of second patterned layers are formed by a method including:
forming a photoresist film on an exposed portion of the first mask layer and a remaining portion of the second mask layer by a spin-coating method; and
performing an exposure and development process on the photoresist layer to form the plurality of second patterned layers.

15. A method for fabricating a semiconductor device, comprising:
forming a plurality of gate structures on a base structure, a source/drain region in the base structure on each side of each gate structure, and an interlayer dielectric layer on the base structure to cover sidewall surfaces of the gate structures, wherein the plurality of gate structures are separated by a plurality of isolation areas;
forming a first mask layer to cover the interlayer dielectric layer and the gate structures and a second mask layer to cover the first mask layer, wherein the second mask layer and the first mask layer are made of different materials;
forming a plurality of second patterned layers on the second mask layer, wherein the plurality of second patterned layers are formed vertically above the isolation areas between neighboring source and drain regions;

forming a patterned second mask layer by etching the second mask layer using the plurality of second patterned layers as an etch mask until a portion of the first mask layer is exposed;

forming a plurality of first patterned layers separated by a plurality of first openings on an exposed portion of first mask layer and a remaining portion of the second mask layer, wherein a projected pattern of the plurality of first patterned layers covers at least top surfaces of the gate structures, and each first opening is formed across a source region, a drain region, and a portion of an isolation area formed the source region and the drain region;

forming a patterned first mask layer by etching the first mask layer using the plurality of first patterned layers as an etch mask until a portion of the interlayer dielectric layer is exposed;

forming a plurality of contact vias to expose top surfaces of source/drain regions by etching the interlayer dielectric layer using the patterned first mask layer and the patterned second mask layer as an etch mask; and forming a plurality of metal silicide layers on the source/drain regions exposed in the plurality of contact vias.

16. The method for fabricating the semiconductor device according to claim 15, wherein:

an isolation layer is formed in the isolation areas;

each second patterned layer is formed vertically above a portion of the isolation layer between a source region and a neighboring drain region; and each first opening is formed vertically above a source region, a neighboring drain region, and a portion of the isolation layer between the source region and the drain region.

17. The method for fabricating the semiconductor device according to claim 15, wherein:

the first mask layer is made of one of $SiO_x$, $SiN_x$, SiON, SiCN, SiCON, TiN, and TaN; and the second mask layer is made of one of $SiO_x$, $SiN_x$, SiON, SiCN, SiCON, TiN, and TaN.

* * * * *